US00RE37637E

(19) United States
(12) Reissued Patent
Clifton et al.

(10) Patent Number: US RE37,637 E
(45) **Date of Reissued Patent: *Apr. 9, 2002**

(54) SMART CARDS HAVING THIN DIE

(75) Inventors: Mark Bradford Clifton, West Windsor, NJ (US); Richard Michael Flynn, Noblesville, IN (US); Fred William Verdi, Lawrenceville, NJ (US)

(73) Assignee: Lucent Technologies Inc., Murray Hill, DE (US)

( * ) Notice: This patent is subject to a terminal disclaimer.

(21) Appl. No.: 09/433,094

(22) Filed: Nov. 3, 1999

Related U.S. Patent Documents

Reissue of:
(64) Patent No.: 5,719,437
Issued: Feb. 17, 1998
Appl. No.: 08/635,072
Filed: Apr. 19, 1996

(51) Int. Cl.[7] ..... H01C 23/02
(52) U.S. Cl. ..... 257/679; 257/669; 257/679; 257/728; 257/782
(58) Field of Search ..... 257/669, 672, 257/679, 728, 782

(56) References Cited

U.S. PATENT DOCUMENTS

| | | | | | |
|---|---|---|---|---|---|
| 4,962,415 | A | | 10/1990 | Yamamoto et al. | 357/74 |
| 5,163,728 | A | * | 11/1992 | Miller et al. | 294/99.1 |
| 5,480,842 | A | * | 1/1996 | Clifton et al. | 257/679 |
| 5,489,637 | A | * | 2/1996 | Nguyen et al. | 524/377 |
| 5,546,275 | A | * | 8/1996 | Moutrie et al. | 361/707 |
| 5,561,328 | A | * | 10/1996 | Massingill et al. | 257/786 |
| 5,619,165 | A | * | 4/1997 | Fournel et al. | 257/233 |
| 5,719,437 | A | * | 2/1998 | Clifton et al. | 257/679 |
| 6,051,877 | A | * | 4/2000 | Usami et al. | 257/679 |

* cited by examiner

*Primary Examiner*—Fetsum Abraham
(74) *Attorney, Agent, or Firm*—Barry H. Freedman

(57) ABSTRACT

Thin semiconductor die, approximately 0.004 to 0.007 inches thick, are positioned substantially on the neutral plane of a smart card, the neutral plane defined as the plane of substantially no mechanical strain during flexure of the smart card, thereby providing smart cards having improved resistance to mechanical flexure, and/or smart cards having improved RF performance.

7 Claims, 3 Drawing Sheets

| CONSTRUCTION TYPE | DIE THICKNESS | DISTANCE BETWEEN ACTIVE SURFACE OF SEMICONDUCTOR DTE AND NEUTRAL PLANE OF SMART CARD |
|---|---|---|
| FIG. 1 (PRIOR ART) | 0.011" to 0.015" | 0.004" to 0.006" |
| FIG. 2 | 0.006" | 0.0005" |
| FIG. 3 | 0.004" | 0.002" |

SMART CARDS HAVING THIN DIE

Matter enclosed in heavy brackets [ ] appears in the original patent but forms no part of this reissue specification; matter printed in italics indicates the additions made by reissue.

CROSS-REFERENCE TO RELATED APPLICATION

Related subject matter is disclosed in the co-pending, commonly assigned U.S. patent application of E. Suhir—1, Ser. No. 08/551,241, filed on Oct. 31, 1995, entitled "Data Carriers Having An Integrated Circuit Unit", in the co-pending, commonly-assigned U.S. patent application of Clifton-Flynn-Verdi 4-6-15, Ser. No. 08/558,579, filed on Oct. 31, 1995, entitled, "Smart Card Having a Thin Die", and in U.S. Pat. No. 5,480,842 issued on Jan. 2, 1996 to Clifton, Flynn, and Verdi.

BACKGROUND OF THE INVENTION

1. Field of the Invention

This invention relates generally to semiconductor devices, and more particularly to semiconductor die that are used in the manufacture of smart cards.

2. Background Art

Existing smart cards may fail when, due to applied mechanical stress, the semiconductor die of the smart card breaks. Mechanical stress is inherent in typical smart card operational environments, such as point-of-sale terminals, electronic cash machines, credit card reading devices, wallets, pockets, and purses. Semiconductor die strength is a significant factor in determining the overall durability and reliability of a smart card. Die thickness affects the ability of a semiconductor die to withstand flexure and applied mechanical force.

In the field of semiconductor fabrication, skilled artisans attempt to use the thickest semiconductor die that will fit within a smart card package. This approach is based upon an assumption that die strength is proportional to die thickness. Since existing smart card packages are approximately 0.030 inches thick, this dimension places a constraint on the maximum thickness of the semiconductor die which will fit within the package. To this end, note that it is not feasible to use semiconductor die that are about 0.030 inches thick. In addition to the die itself, the space within the smart card package is also occupied by lead terminations, structures that protect the die and/or the leads, labeling, magnetic striping, and discrete circuit components. Therefore, die thickness on the order of 0.011 inches are employed, representing the maximum die thickness that can easily fit within a smart card package. Semiconductor die thinner than 0.011 inches are typically not used in smart cards, as such die have traditionally been difficult to handle during the manufacturing process, and the resulting manufacturing expenses are relatively high. Furthermore, conventional wisdom dictates that, as the thickness of a die is decreased, the die become increasingly vulnerable to mechanical failure.

A shortcoming of existing 0.011-inch die is that the die do not provide sufficient immunity to mechanical flexure. When such die are used to fabricate smart cards, breakage and card failure may result if the smart card user bends or flexes the card. Accordingly, flexure is an especially important physical property to consider for smart card applications. In order to improve performance in this area, existing approaches have focused on strengthening the 0.011-inch die through the optimization of specific individual design parameters, such as grinding parameters, dicing parameters, and others. As opposed to integrating these design parameters into a broad-based design solution, typical approaches have adopted a piecemeal approach by considering the effects of only one or two design parameters on flexure resistance. For example, in material systems having high thermal coefficients of expansion, design parameters have been optimized for the purpose of increasing die tolerance to severe thermal transient conditions.

Another shortcoming of existing smart card semiconductor die designs is that little, if any, consideration is given to RF (radio frequency) performance issues. For example, one presently-available smart card requires direct mechanical and electrical contact during use, whereas another type of smart card uses signals in the extremely-low-frequency (ELF) area of the RF spectrum, in the range of 300 to 20,000 Hz, with existing industry-standard UART protocols of 2400, 4800, 9600, and/or 19,200 band. Existing smart cards do not operate at frequencies above the ELF region. Although transponder devices and pagers have been developed for use at higher frequencies, such devices occupy a much larger physical volume than is available within the confines of a smart card. Meanwhile, in relatively recent times, high-speed microprocessors operating at speeds of around 100 Mhz have been developed, and radio frequencies in the 800 and 900-Mhz regions of the frequency spectrum are now enjoying widespread use.

Consider a two-inch lead used in an existing smart card package. This lead provides negligible inductive reactance at 1 Khz, on the order of a fraction of an ohm. That same lead, used at 500 Mhz, provides an inductive reactance of several hundred ohms, which may severely disrupt desired circuit operations at higher frequencies. Moreover, when an existing semiconductor dice having a thickness of 0.011 inches is used to fabricate active semiconductor device, these devices provide electron transit times on the order of several tenths of microseconds, effectively limiting device operation to frequencies less than about 10 Mhz.

Existing field-effect transistors for use in the UHF and microwave regions of the RF spectrum use die thicknesses in the order of 0.00236 inches, so as to provide a relatively short electron transit time. These short electron transit times provide increased high-frequency performance. One technique for fabricating these field-effect transistors is described in U.S. Pat. No. 5,163,728 issued to Miller and entitled, "Tweezer Semiconductor Die Attach Method and Apparatus". Unfortunately, the methods and systems described in the Miller patent are only practical when used to construct discrete transistor devices. The use of tweezer-based devices to construct smart cards is impractical because it would be much too labor-intensive, time-consuming, and expensive. What is needed is an improved technique for constructing a smart card that has enhanced RF (radio frequency) properties.

Smart card packages are about 0.030 inches thick, thereby providing a package that is very similar in dimensions to that of a conventional credit card. Note that existing smart card packaging techniques place the semiconductor die near the surface of the card, due to tight packaging and interconnect requirements, and also because the thickness of the die represents a substantial portion of the thickness of the actual smart card package. Therefore, if a user bends a smart card back and forth, the semiconductor die, being situated near the surface of the card, is subjected to relatively high levels of mechanical stress.

RF coupling, as opposed to direct physical contact, is a more advantageous technique for sending and receiving data to and from a smart card, in terms of user convenience and smart card reliability. However, semiconductor die material functions as a lossy dielectric, attenuating RF signals that are incident thereupon, including the signals that are used to couple data to and from the smart card. This attenuation limits the maximum coupling distance between a smart card and a smart card reader, and also restricts the position in which a smart card must be held relative to a smart card reader/writer, in order to successfully read and write data from and to the smart card. The attenuation is substantially proportional to the thickness of the semiconductor die used to fabricate the smart card, inasmuch as the smart card packaging material is a nonconductive plastic encapsulant offering very minimal RF attenuation, and the conductive leads to and from the semiconductor die occupy an inconsequential portion of the smart card package.

SUMMARY OF THE INVENTION

Improved smart card semiconductor die are provided that have a thickness of approximately 0.004 to 0.007 inches. These die are positioned at or near the neutral plane (i.e., plane of substantially zero mechanical strain during flexure) of a smart card, thereby providing smart cards having improved resistance to mechanical flexure and/or enhanced performance at RF frequencies.

DETAILED DESCRIPTION

Figure 1:
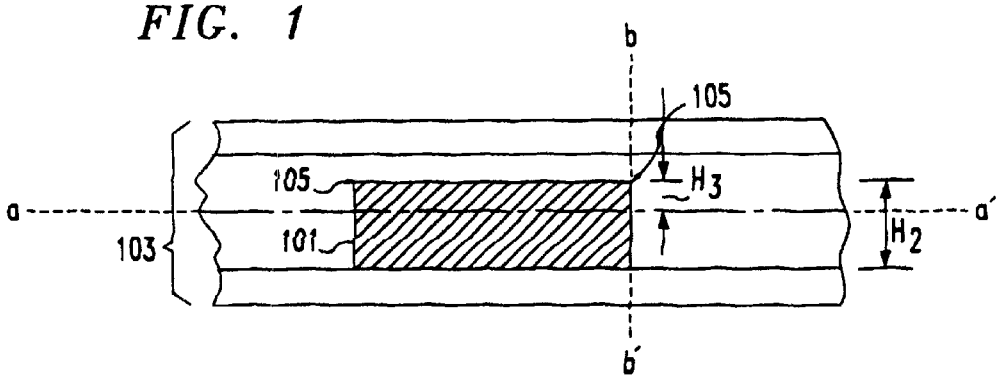
FIG. 1 is a cross-sectional view of a prior art smart card semiconductor die.

Existing die strength improvement techniques have not adequately addressed applications involving mechanical die flexure. In the context of smart card semiconductor die, during mechanical flexure, the mechanical stresses are greatest near the card surface, and are at a minimum value along a neutral plane within the body of the smart card. The neutral plane of the smart card may be defined as the plane of no strain during mechanical flexure of the smart card. If it is assumed that the smart card package is of a substantially uniform composition throughout, with no internal cavities, this neutral plane is at a depth approximately equal to half the thickness of the smart card, i.e., the "mid-plane" of the smart card. However, as a practical matter, the smart card package must contain a cavity for accommodating the semiconductor die. Additionally, stickers, laminates, and/or other types of dressing materials may be applied to the surface of the smart card for identification or ornamentation. These cavities, laminates, and/or stickers may shift the location of the neutral plane to a location that is not approximately equal to half the thickness of the smart card. However, the location of the neutral plane may be determined empirically, and/or with resort to mathematical calculations well-known to those skilled in the art.

Since the mechanical stresses are substantially zero at any point on the neutral plane, it would be desirable to position the semiconductor die at or near the neutral plane. However, even if an existing 0.011 inch die is centered along the neutral plane, the sheer thickness of the die itself results in portions of the die being located in higher stress regions near the surface of the card. Note that the thickness of a smart card must be limited to about 0.030 inches if the smart card is to physically resemble a conventional credit card. In order to provide physical space within the 0.030-inch-thick smart card package for electrical connections to a semiconductor die that is 0.011 inches thick, the semiconductor die must be mounted relatively close to a surface of the smart card.

It is generally difficult or impossible to situate a conventional 0.011-inch-thick semiconductor die on or near the neutral plane (i.e., within a few thousandths of an inch), even if the location of the neutral plane is shifted from a mid-plane location through the use of cavities in the smart card package, non-uniform smart card package composition, and/or the application of stickers or laminates to the smart card package. What is needed is a thinner die, such that the entire die can be situated at or near the neutral plane.

One advantage of using a thin semiconductor dice is that a smart card having enhanced RF performance is provided. For example, when an existing semiconductor dice having a thickness of 0.011 inches is used to fabricate active devices for use in a smart card, these active devices often provide electron transit times on the order of several tenths of microseconds, effectively limiting device operation to frequencies less than about 4 MHz. To this end, note that existing RF transistors for use at VHF and UHF frequencies generally use die much thinner than 0.011 inches, and typically in the range of 0.004 to 0.007 inches. By using a thin dice having a thickness in the range of from 0.004 to 0.007 inches in a smart card, relatively short electron transit times are provided, enabling active device operation in the MF, HF, VHF, UHF, and/or microwave frequency ranges.

Device operation at higher frequencies is advantageous in that a smart card is no longer limited to using industry-standard UART protocols, the fastest of which operates at 19,200 baud. (Note that other standard UART protocols used by existing smart cards operate at 2400 baud and/or 4800 baud.) In addition to being adapted for use with these conventional UART protocols, the thin smart card semiconductor die disclosed herein are also adapted for use with faster data transfer protocols and modulation schemes that operate at higher speeds than conventional UART protocols. These faster data transfer protocols and modulation schemes may be associated with higher-frequency RF carriers above 20 Khz, such as, for example, in the HV, VHF, UHF, and/or microwave regions of the RF spectrum. Such high-frequency RF carriers may be employed in conjunction with known RF modulation schemes as for example, QAM (quadrature amplitude modulation), PCM (pulse-coded modulation), FM (frequency modulation), SSB (single-sideband modulation), and others.

If a smart card uses RF encoding, as opposed to direct physical contact, for sending and receiving data, the use of a thin semiconductor dice provides another advantage. As discussed above, semiconductor die material functions as a lossy dielectric, attenuating RF signals that are incident thereupon. Since this attenuation is roughly proportional to the thickness of the die, the use of a thin die reduces the extent to which RF signals are attenuated by the smart card. This reduced attenuation, in turn, increases the maximum allowable coupling distance between a smart card and a smart card reader/writer, and also increases the number of locations in which a smart card can be held relative to a smart card reader/writer, in order to successfully read and write data from and to the smart card.

FIG. 1 is a cross-sectional view of a prior art smart card semiconductor die 101 mounted in a conventional smart card package 103. Active devices, such as transistors and diodes, are fabricated near active surface 105 of semiconductor die 101. Conventional smart card package 103 has a neutral plane which, in the cross-sectional view of FIG. 1, is represented by axis a–a'. The neutral plane is defined as the plane of substantially zero mechanical strain during mechanical flexure of the smart card package 103. The semiconductor die 101 is about 0.010 to 0.015 inches thick along axis b–b', denoted as distance $H_2$. The active surface 105 of the die is positioned at a distance $H_3$ greater than 0.005 inches from the smart card neutral plane.

Figure 2:
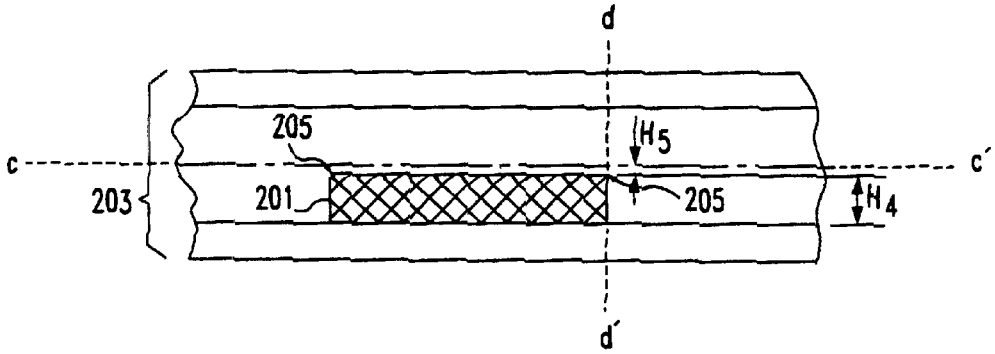
FIG. 2 is a cross-sectional view of a thin smart card semiconductor die fabricated in accordance with a first embodiment disclosed herein.

FIG. 2 is a cross-sectional view of a smart card semiconductor die 201 fabricated in accordance with a first embodiment disclosed herein. Typically active devices, such as transistors and diodes, are fabricated near active surface 205 of semiconductor die 201. Smart card package 203 has a neutral plane which, in the cross sectional view of FIG. 2, is represented by axis c–c'. However, unlike the semiconductor die 101 of FIG. 1, semiconductor die 201 has a thickness along axis d–d' of about 0.004 inches, represented as $H_4$. Axis d–d' may be conceptualized as running parallel to the thinnest dimension of semiconductor 201, and/or running perpendicular to a plane including semiconductor die 201. The semiconductor die active surface 205 is situated at a distance $H_5$ of 0.001 inches or less from the smart card neutral plane, represented as axis c–c' in FIG. 2.

Although the semiconductor die 201 of FIG. 2 is very thin compared to typical 0.011-inch die, the use of a thin die is advantageous in smart card design applications. The configuration of FIG. 2 recognizes the semiconductor die 201 as a major structural, load bearing, component of the smart card. A thin die, such as semiconductor die 201, provides greater mechanical flexibility relative to a conventional die that is just barely thin enough to fit within a smart card. For example, the typical 0.011-inch die used in smart cards will not deflect as far as an 0.006-inch die if both die are fabricated to have equivalent yield strengths. The term "yield strength" is well understood by those skilled in the art.

Figure 3:
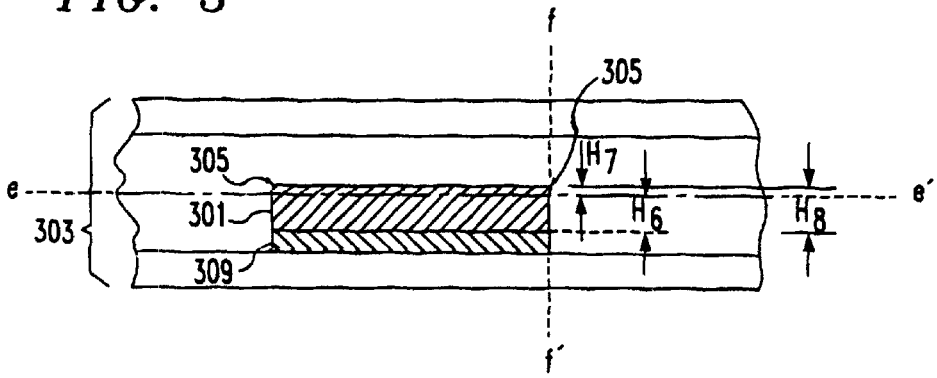
FIG. 3 is a cross-sectional view of a thin smart card semiconductor die fabricated in accordance with a second embodiment disclosed herein.

FIG. 3 is a cross-sectional view of a thin smart card semiconductor die 301 fabricated in accordance with a second embodiment disclosed herein. As in the case of semiconductor die 201 of FIG. 2, active devices, such as transistors and diodes, are fabricated near active surface 305 of semiconductor die 301. Smart card package 303 has a neutral plane which, in the cross sectional view of FIG. 3, is represented by axis e–e'. Unlike the semiconductor die 101 of FIG. 1, semiconductor die 301 has a thickness along axis f–f' of about 0.004 inches, represented as $H_8$. The semiconductor die active surface 305 is situated at a distance $H_7$ of 0.001 inches or less from the smart card neutral plane, represented as axis e–e' in FIG. 3. Unlike the semiconductor die 201 of FIG. 2, semiconductor 301 is mounted to smart card package 303 using a physical standoff 309. Physical standoff 309 functions as a mechanical spacer, holding the active semiconductor die 301 at a desired spatial relationship with respect to the neutral axis of the smart card, denoted as e–e'. For example, this desired spatial relationship may be to position the active surface 305 of semiconductor die 301 as close as possible to the neutral axis of the smart card. An optional bonding agent may be employed to fasten the physical standoff to the semiconductor die and/or to the smart card package 303. Virtually any material can be employed for the bonding agent, so long as the material adheres to semiconductor die 301, and/or to smart card package 303. However, the elastic properties of the bonding agent should also be considered. For example, the bonding agent should be relatively elastic, deformable, and flexible, to provide the semiconductor die 301 with some freedom of motion relative to the smart card package while the smart card package is being bent. Rubber, epoxies, cyanoacrylate esters (acrylics), and/or other types of materials are suitable for use as bonding agents.

Figures 4, 5:
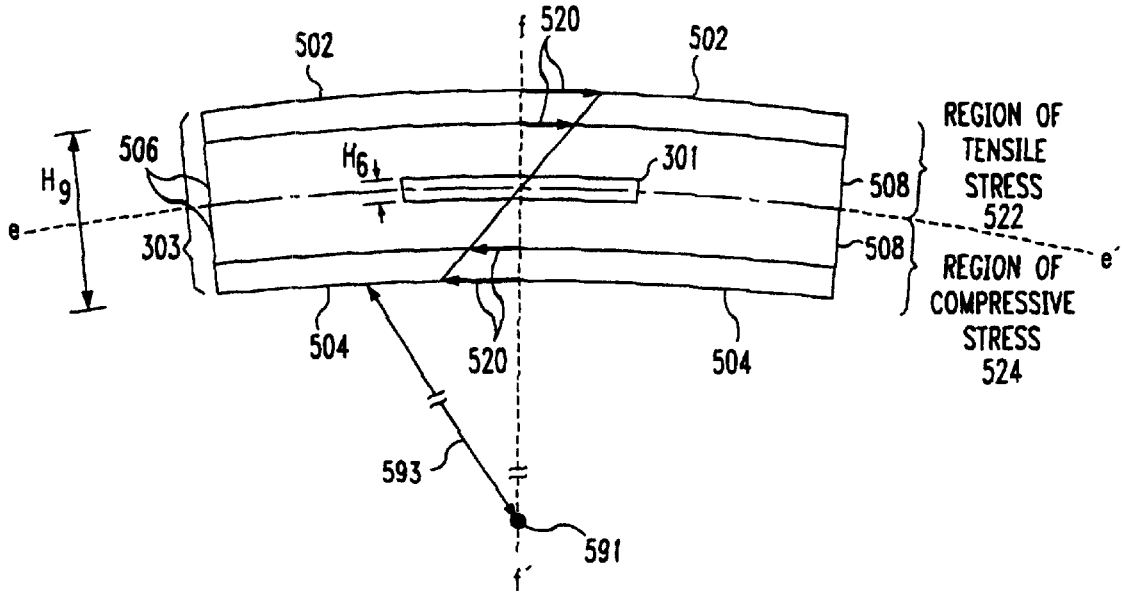
FIG. 4 is a table comparing various physical parameters of the smart card semiconductor die shown in FIGS. 1, 2, and 3.
FIG. 5 is a cross-sectional view of the smart card semiconductor die of FIG. 2 in a state of mechanical flexure.

FIG. 4 is a table comparing various physical parameters of the smart card semiconductor die shown in FIGS. 1, 2, and 3. The design of FIG. 1 has a die thickness of 0.015 inches, and the active surface of the semiconductor die is positioned at a relatively great distance of about 0.006 inches from the neutral plane of the smart card. When this smart card is bent, the active surface of the semiconductor die will experience relatively great forces due to the relatively great distance between the neutral plane and the active surface. By contrast, the smart card design of FIG. 2 has a die thickness of 0.006 inches, and the active surface of the semiconductor die is positioned at a relatively short distance of 0.0005 inches from the neutral plane of the smart card. When this smart card is bent, the active surface of the semiconductor die will experience relatively minimal forces due to the relatively short distance between the neutral plane and the active surface. Similarly, the smart card structure of FIG. 3 has a die thickness of 0.004 inches and the active surface of the semiconductor die is situated 0.002 inches from the neutral plane of the smart card.

FIG. 5 is a cross-sectional view of a smart card 500 constructed in accordance with FIG. 3 and in a state of mechanical flexure. Such mechanical flexure exists, for example, when a user bends the smart card 500. One must assume that smart cards will be exposed to flexure during conditions of ordinary or typical usage. The smart card 500 shown in FIG. 5 has a thickness $H_9$, an upper surface 502, a lower surface 504, a left-hand edge 506, and a right-hand edge 508. The smart card is flexed (bent), thus forming an arcuate surface at a radius 593 from a focal point 591. In other words, the edges 506, 508 of the smart card are being forced together, and the middle of the smart card along axis f–f' is being pushed upwards. This may happen if the smart card 500 is resting on a surface, and someone grasps the card at opposite ends with thumb and fingertips while moving thumb and fingertips closer together, or when smart card 500 is placed in a wallet in the smart card user's rear pocket and the user proceeds to assume a sitting position. A region of tensile stress 522 is formed above the neutral plane, represented by axis e–e' in FIG. 5, and a region of compressive stress 524 is formed below axis e–e'. A semiconductor die 301 is incorporated into smart card 500, and this die has a thickness of $H_9$. The strains within smart card 500 are shown as vectors 520.

Figure 6:
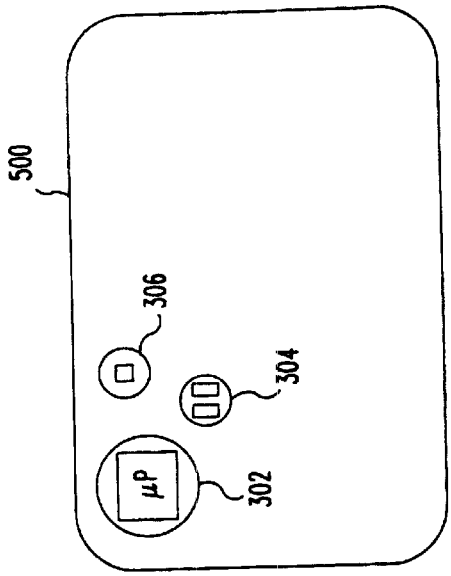
FIG. 6 and FIG. 7 are a plan view of a smart card showing representative locations for various smart card components.

A plan view of the smart card 500 described in FIG. 5 is illustrated in FIG. 6. Referring now to FIG. 6, a smart card 500 is shown, along with representative locations for various smart card components. For example, smart card 500 includes microprocessor 302, chip capacitors 304, and a voltage regulation/data conditioning die 306.

Figure 7:
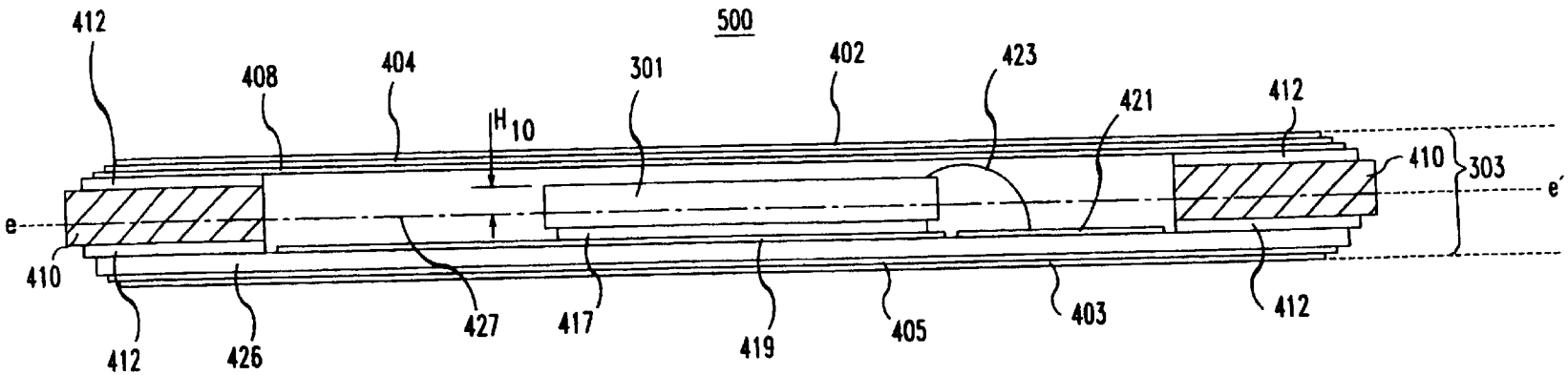

A more detailed cross-sectional view of the smart card 500 of FIG. 5 is shown in FIG. 7. In the example of FIG. 7, semiconductor die 301 is a thin semiconductor die having a thickness less than 0.011 inches and positioned at or near the neutral plane of the smart card package 303. The smart card 500 includes one or more polyvinyl chloride (PVC) labels 402, 403 which are affixed to upper and lower surfaces, respectively, of smart card 500 with adhesive layers 404, 405, respectively. Adhesive layer 404 adjoins woven material 408. Woven material 408 is affixed to polyester structural members 410 using an adhesive layer 412. Polyester structural members 410 and adhesive layers 412 are configured to form a cavity, in which is mounted semiconductor die 301. Die attach epoxy 417 and optional mechanical stand-off material is used to mount the semiconductor die 301 onto a copper pad 419. Die encapsulation material 427 is used to protect and insulate the semiconductor die 301, and to maintain the spacing and positioning of wire bonds 423. Die encapsulation material 427 should have very high resistivity, i.e. be a good electrical insulator, provide good thermal conductivity to carry heat away from semiconductor die 301, provide a hermetic and watertight seal, adhere well to semiconductor die 301, provide mechanical flexibility and deformability, and provide non-corrosivity with respect to the semiconductor die 301 and any metallic traces that are connected to semiconductor die 301. Copper pad 419 is traced onto a polyester printed circuit board 426, which may include additional copper pads 421. All or some of these additional copper pads 421 may be electrically connected to the semiconductor die 301 via one or more wire bonds 423. Adhesive layer 405 is used to attach PVC label 403 to the underside of the printed circuit board 426.

When the smart card 500 is bent, the resulting mechanical strains are shown as vectors 520 in FIG. 5. At a given distance from the neutral plane of the smart card, these strains are lowest in relatively stiff smart card structural components and greatest in relatively flexible smart card structural components. With respect to FIG. 7, strains are lowest in structural components such as semiconductor die 301, and strains are greater in polyester structural members 410 and adhesive layers 404 and 405. However, the magnitude of mechanical strain existing in a given smart card component is also dependent upon the positioning of that component relative to the neutral plane of the smart card. In general, the strains for each component are greatest near the outer surface of the component and at a maximum near polyvinyl chloride (PVC) labels 402 and 403. The strains are zero along axis e–e', representing a two-dimensional projection of the neutral plane in FIG. 7. If the smart card 500 of FIG. 7 is bent as shown in FIG. 5, then the smart card structural components above this neutral plane are in tension, and the structural components below this neutral plane are in compression. The semiconductor die 301 is positioned so that the devices (diodes and transistors) on the die are at or near (within 0.007 inches of) the neutral plane.

In order to mathematically calculate the amount of strain on semiconductor die 301 when this die is packaged into a smart card 500, and to calculate the location of the neutral plane within the smart card 500, the entire smart card structure of FIG. 7 must be considered. This calculation requires the performance of mathematically complex operations that are best completed using an analysis tool known to those skilled in the art as the finite element method. However, to simplify matters a bit, in practice, the loading on the chip is determined by card flexure and is dominated by the shape of the card structure. To simplify further, when the chip cavity of FIG. 7 is omitted from the calculation of mechanical strain, the neutral plane, represented by axis e–e', is at a distance $H_{10}$ from the upper smart card surface, and also at a distance of $H_{10}$ from the lower smart card surface. In other words, the neutral plane is situated halfway between the upper and lower smart card surfaces, i.e., in the mid-plane of the smart card 500.

Reducing $H_{10}$ reduces the amount of stress on the smart card die 301. This reduction in $H_{10}$ is achieved by using as thin a die as is practicable for semiconductor die 301. Further improvements are achieved by constructing smart card 500 such that the most fragile portion of the semiconductor die 301 is at or near the neutral plane. This portion is typically the location at which active devices, such as transistors and diodes, are situated within the semiconductor die 301. More specifically, the interface between the conducting (metal-doped) portion of the die and the semiconducting (i.e., N- or P-doped silicon body) of the remainder of the die is the most fragile portion of semiconductor die 301. This interface is approximated by the active surface defined above. Locating this interface at the neutral plane further protects the semiconductor die 301 from mechanical strain, resulting in a smart card 500 with improved reliability. polyvinyl chloride (PVC) labels 402 and 403. The strains are Traditional smart card packaging techniques place the die near the surface of the card due to stringent packaging and interconnect requirements. However, according to an embodiment disclosed herein, semiconductor die 301 are situated as close as possible to the neutral plane, e–e', of smart card 500. In this manner, the effective level of mechanical stress transmitted to the semiconductor die 301 by the smart card package 303 during mechanical flexure is substantially reduced. The smart card package 303 thus affords extra protection to the semiconductor die 301 by reducing the mechanical stresses realized upon the die.

Various techniques may be employed to fabricate the relatively thin semiconductor die 201 (FIG. 2) and 301 (FIGS. 3, 5, and 7) of the embodiments disclosed herein. However, note that traditional semiconductor die fabrication techniques for conventional 0.011-inch die cannot be used to effectively fabricate thin die having a thickness of 0.008 inches or less. These existing techniques are designed to maximize the number of usable 0.011-inch semiconductor die produced during a given time period. If the die are handled and produced too carefully, it will take too long to produce the die, and production efficiency will suffer. On the other hand, if the die are handled and produced too roughly, more die will be produced, but an undesirable high proportion of these die will be defective and unusable. Therefore, existing techniques strike a balance between rough handling and careful handling, so that the maximum number of usable 0.011-inch die will be generated during a given time interval.

When these existing techniques are applied to fabricate thin die of 0.008 inches or less, the thinner die are more fragile during the handling and fabrication process than conventional 0.011-inch smart card semiconductor die. Substantially improved yields of thin semiconductor die may be obtained if special die fabrication techniques are applied to the semiconductor wafer from which the thin semiconductor die are made. These fabrication techniques include taping the semiconductor wafer with conventional UV dicing tape and then immersing the wafer into an acid bath. The acid bath, which may include nitric acid, hydrofluoric acid, and acetic acid in relative proportions of 7:2:1, provides chemical stress relief for the semiconductor wafer. Additionally, the semiconductor wafer may be diced using a dicing saw, soft rubber or plastic die pickup heads, non-piercing ejector pins, and servo or programmable dynamic ejector pins to reduce or eliminate die damage. Moreover, the die may be ejected from the dicing tape using velocity-controlled or programmable servo-controlled, non-piercing ejector pins. Suitable techniques for manufacturing smart card semiconductor die are set forth in greater detail in U.S. Pat. No. 5,480,842 entitled, "Method for Fabricating Thin, Strong and Flexible Die for Smart Cards".

The invention claimed is:

1. A semiconductor die for use in a smart card, characterized in that the semiconductor die is [less than 0.008] *between 0.004 and 0.007* inches thick.

2. A semiconductor die for use in a smart card, characterized in that:

(a) the semiconductor die is [less than 0.008] *between 0.004 and 0.007* inches thick; and (b) the semiconductor die includes an active device equipped to operate at an RF frequency greater than 20 Khz.

3. A smart card including:

(a) a memory device, and/or (b) a processing device, wherein the memory device and the processing device are fabricated using a semiconductor die having a thickness of [0.008 inches or less] *between 0.004 and 0.007 inches*.

4. A smart card including:

(a) a memory device, and/or (b) a processing device, wherein the memory device and the processing device are fabricated using a semiconductor die having a thickness of [0.008 inches or less] *between 0.004 and 0.007 inches*, and wherein the processing device operates at a speed greater than or equal to 4.0 Mhz.

5. A semiconductor die for use in a smart card package having a neutral plane defined as the plane of substantially zero mechanical strain during mechanical flexure of the smart card package, characterized in that:

(a) the semiconductor die is [less than 0.008] *between 0.004 and 0.007* inches thick, and (b) at least a portion of the semiconductor die is positioned within the neutral plane of the smart card package.

6. A semiconductor die as set forth in claim 5 further including a plurality of diodes and transistors defining an active surface within the semiconductor die, the active surface being positioned within the neutral plane of the smart card package.

7. A semiconductor die as set forth in claim 5 further including a plurality of diodes and transistors defining an active surface within the semiconductor die, the active surface being positioned within the neutral plane of the smart card package, and at least one of the plurality of transistors adapted for operation at an RF frequency greater than 20 KHz.

* * * * *